(12) United States Patent
Kim et al.

(10) Patent No.: US 7,751,230 B2
(45) Date of Patent: Jul. 6, 2010

(54) NEGATIVE VOLTAGE GENERATING DEVICE

(75) Inventors: Yeon Uk Kim, Incheon-si (KR); Young Do Hur, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 111 days.

(21) Appl. No.: 12/207,643

(22) Filed: Sep. 10, 2008

(65) Prior Publication Data
US 2009/0261792 A1     Oct. 22, 2009

(30) Foreign Application Priority Data
Apr. 18, 2008  (KR) ...................... 10-2008-0036311

(51) Int. Cl.
*G11C 11/00* (2006.01)
(52) U.S. Cl. ........................ 365/154; 327/524; 323/234
(58) Field of Classification Search ................. 365/154; 327/524; 323/234
See application file for complete search history.

(56) References Cited
U.S. PATENT DOCUMENTS
7,554,862 B2 * 6/2009 Shibata .................. 365/189.09

FOREIGN PATENT DOCUMENTS
JP      2000-163964 A     6/2000
KR     1019970017591 A    4/1997
KR     1020020084892 A    11/2002

* cited by examiner

*Primary Examiner*—Son Dinh
*Assistant Examiner*—Nam Nguyen
(74) *Attorney, Agent, or Firm*—Ladas & Parry LLP

(57) ABSTRACT

The negative voltage generating device includes a current interrupting controller, a voltage generating controller, and a negative voltage generator. The current interrupting controller outputs a current interrupting control signal in response to a control signal, which is enabled during the application of a power-up signal. The voltage generating controller compares a first reference voltage to a feedback voltage in response to the current interrupting control signal and outputs a voltage generating control signal. The negative voltage generator generates the feedback voltage and a second negative voltage by receiving the first negative voltage in response to the voltage generating control signal.

33 Claims, 9 Drawing Sheets (a)

(b)

NEGATIVE VOLTAGE GENERATING DEVICE

CROSS-REFERENCE TO RELATED APPLICATIONS

The present application claims priority to Korean patent application number 10-2008-0036311 filed on, Apr. 18, 2008 which is incorporated herein by reference in its entirety.

BACKGROUND OF THE INVENTION

The present invention relates generally to a semiconductor memory device, and more particularly to a negative voltage generating device.

A semiconductor dynamic random access memory (DRAM) device includes a plurality of cell capacitors for storing data and a plurality of cell transistors for controlling the input of data to be stored and the output of stored data. Operations which the DRAM performs include data storage, data read, and data refresh for the cell capacitor. In a data refresh, the refresh period is affected to a large degree by leakage current, and accordingly the reduction of leakage current has become an area of much importance.

Leakage current can typically be classified into junction leakage current and channel leakage current.

Junction leakage current is generated by defects in the junction boundary of a cell transistor, and the channel leakage current is a leakage current flowing through the channel of a cell transistor.

The junction leakage current can be reduced by reducing the ion concentration of the channel; however, reducing the ion concentration of the channel causes an increase in the channel leakage current. The channel leakage current can be reduced by increasing the threshold voltage of the cell transistor; however, increasing the threshold voltage of the cell transistor causes the junction leakage current to increase.

In order to reduce both of these leakage currents, negative wordline driving can be used. In negative wordline driving, a high voltage VPP is provided when enabling a wordline, and a negative voltage VNN lower than the ground level is provided when disabling a wordline. The voltage used as the negative voltage lower than the ground level is the voltage used to reverse bias a substrate (that is, the voltage commonly referred to as a backbias voltage VBB in order to distinguish it from the negative voltage VNN).

Negative wordline driving can improve refresh characteristics along with an improvement in the characteristics of other AC parameters. In particular, the refresh time can be reduced, the VPP burden can be reduced when a low level operation voltage Vcc is used, and the Write Recovery Time (tWR) can be improved, and therefore negative wordline driving has been widely used.

FIG. 1 is a block diagram of a voltage generating device for generating a negative voltage VNN.

Referring to FIG. 1, a voltage generating device includes a VNN level detector 10, an oscillator 20, and a pumping unit 30.

The VNN level detector 10 receives a negative voltage VNN, detects the level of the negative voltage, and outputs an oscillator enable signal OSCEN. The oscillator 20 receives the oscillator enable signal OSCEN and generates a pulse signal OSC when the enable signal OSCEN is enabled. The pumping unit 30 receives the pulse signal OSC and performs charge pumping.

The negative voltage generating device shown in FIG. 1 generates a regulated negative voltage using a negative feedback operation. When the negative voltage VNN increases, the level detector 10 enables the enable signal OSCEN, and the oscillator 20 is enabled by the enable signal OSCEN. The negative voltage VNN level is then gradually reduced by the charge pumping until the oscillator 20 is disabled.

The VNN level detector 10 can be configured as shown in FIG. 2. The detector of FIG. 2 includes PMOS transistors M1 and M2, and inverters INV1 and INV2. Referring to FIG. 2, when the negative voltage VNN increases, the source-drain equivalent resistance of the PMOS transistor M2 increases; and thereby, the voltage of node A increases. When the voltage of node A reaches the "trip point" of the inverter, the output signal OSCEN is raised to a high level to enable the oscillator 20, and the enabled oscillator 20 drives the pumping unit 30.

Referring back to FIG. 1, the pumping unit 30 includes a capacitor C and two diodes D1 and D2. When the pulse signal OSC output from the oscillator 20 is high, the voltage of node B is clamped into a threshold voltage Vth higher than a ground voltage by the diode D1, and the capacitor C is charged with a positive voltage VDD. When the pulse signal OSC is low, the capacitor C supplies negative charges through the diode D2.

FIG. 3 shows a waveform of the negative voltage VNN generated using the configuration of FIGS. 1-2. Referring to FIG. 3, it can be appreciated that when using the configuration of FIGS. 1 and 2, the negative voltage VNN has a relatively large ripple.

The negative voltage generated as above is biased into a negative voltage of a wordline. The backbias voltage VBB provided to the wordline is generated using the same method as that used to generate the negative voltage to be biased into the word line.

FIG. 4 shows a typical sub wordline driver that receives the negative voltage VNN.

Referring to FIG. 4, the CMOS sub wordline driver includes one PMOS transistor M3 and two NMOS transistors M4, M5.

One terminal of the PMOS transistor M3 is connected to a sub wordline driving voltage FX, and the other terminal is connected to a sub wordline SWL. The gate of the PMOS transistor M3 is connected to an inverted main wordline MWLB. One terminal of the NMOS transistor M4 is connected to the sub wordline SWL and the terminal of the PMOS transistor M3 connected to the sub wordline SWL. The remaining terminal of the NMOS transistor M4 is connected to the negative voltage VNN. The gate of the NMOS transistor M4 is connected to the inverted main wordline MWLB (as in the PMOS transistor M3). One terminal of the NMOS transistor M5 is connected to the sub wordline SWL, and the other terminal thereof is connected to the negative voltage VNN.

The backbias voltage VBB is applied as the substrate voltage to the NMOS transistors M4, M5.

Parasitic diodes D3, D4 are formed between the substrate (P-type impurity) and the source (N-type impurity) of the NMOS transistors M4, M5. When the ripple of the backbias voltage VBB applied to the substrate and the negative voltage VNN applied to the source is large, the voltage difference of the backbias voltage VBB and the negative voltage VNN may be higher than the threshold voltage of the parasitic diodes at certain time points. If the parasitic diodes D3, D4 are turned on, undesired leakage current flows thereby causing malfunctions in the semiconductor device.

The backbias voltage VBB is generated using aforementioned method. The backbias voltage VBB and the negative voltage VNN applied to the sub wordline are operated independently, and thus the large ripple of the backbias voltage VBB may be higher than the negative voltage VNN at a certain time point. FIG. 5 confirms that the potential difference of the backbias voltage VBB and the negative voltage VNN can be higher than Von In order to prevent malfunction in the semiconductor device, a stable backbias voltage having a small ripple is needed.

SUMMARY OF THE INVENTION

Embodiments of the present invention include a negative voltage generating device which provides a stable negative voltage having a small ripple.

Additionally, the present invention provides a negative voltage generating device capable of reducing current consumption by interrupting the current path during initial operation.

Additionally, the present invention provides a semiconductor device capable of selectively operating only a portion of a plurality of negative voltage generators.

A negative voltage generating device according to an embodiment of the present invention includes: a current interrupting controller outputting a current interrupting control signal in response to a control signal enabled at the time of an application of a power-up signal; a voltage generating controller comparing first reference voltage with feedback voltage in response to the current interrupting control signal and outputting a voltage generating control signal; and a negative voltage generator generating the feedback voltage and second negative voltage based on first negative voltage by receiving the first negative voltage in response to the voltage generating control signal.

Preferably, the first negative voltage is backbias voltage having a lower voltage level than the second negative voltage.

The current interrupting controller may include a first current interrupting controller which receives voltage with a positive level and the second reference voltage with a negative level to output one of them as the first current interrupting control signal in response to the control signal; and a second current interrupting controller which outputs the backbias voltage as a second current interrupting control signal in response to the control signal.

The second current interrupting controller may include a level shifter changing the control signal level into a level sufficient to turn on or turn off a MOS transistor; and a backbias voltage supplier supplying the backbias voltage as the second current interrupting control signal when the signal output from the level shifter is enabled.

The voltage generating controller may include a bias supplier supplying the voltage having the positive level in response to the first current interrupting control signal; and a comparator comparing the first reference voltage and the feedback voltage when voltage is supplied from the bias supplier and outputting the voltage generating control signal.

Preferably, the comparator is floated from the backbias voltage when the second current interrupting control signal is a low level.

Preferably, the comparator includes a first PMOS transistor receiving the first reference voltage as its gate input, a second PMOS transistor receiving the feedback voltage as its gate input, a first NMOS transistor having a drain terminal connected to the first PMOS transistor and a gate terminal receiving the second current interrupting control signal, and a second NMOS transistor having a drain terminal connected to the second PMOS transistor and a gate terminal receiving the second current interrupting control signal.

Preferably, the voltage generating control signal is output through a connection node of the first PMOS transistor and the first NMOS transistor and the second current interrupting control signal is applied to the connection node.

The negative voltage generator may include a negative voltage output unit outputting the backbias voltage as the second negative voltage in response to the voltage generating control signal; and a feedback voltage generator generating the feedback voltage by dividing the potential between the voltage with the positive level and the second negative voltage.

The negative voltage generator may further include a noise removing unit which is connected to a node outputting the feedback voltage to remove noise of the feedback voltage with one side being connected to the voltage with the positive level and the other side being connected to the second negative voltage.

The negative voltage output unit may include a MOS transistor turned on when the voltage generating control signal is enabled to apply the backbias voltage.

The negative voltage generating device may further include a control signal generator which combines an active signal and a power up signal enabled at the time of the application of power and generates the control signal.

Preferably, the control signal is enabled when the power up signal is enabled or the power up signal is disabled.

The negative voltage generating device may further include a reference voltage supplier which generates reference voltage using external voltage and supplies the reference voltage as the first and second reference voltages by division of the reference voltage.

The reference voltage supplier may include a reference voltage generator generating the reference voltage using a band gap type or a widlar type circuit; a level setting unit dividing the reference voltage and outputting voltage with a level corresponding to the first and second reference voltages; and a driver unit outputting the voltage output from the level setting unit as the first and second reference voltages but outputting the reference voltage reaching a targeted value by supplying external voltage when the voltage level is below the targeted value of the first and second reference voltage levels.

The level setting unit may include a differential comparator outputting the reference voltage while maintaining the reference voltage at a predetermined level; and a reference voltage divider generating and outputting the output of the differential comparator at a level corresponding to the first and second reference voltages using a resistance ratio.

A negative voltage generating device according to another embodiment of the present invention includes: a reference voltage generator generating first and second reference voltages each having a negative level; a first negative voltage generator receiving the reference voltages and backbias voltage in response to an active signal and a power up signal to generate negative voltage; and a second negative voltage generator receiving the reference voltage and the backbias voltage in response to the power up signal and outputting negative voltage.

Preferably, the first negative voltage generator is operated only when the power up signal is disabled and the active signal is then enabled.

Preferably, the second negative voltage generator is operated immediately after the power up signal is disabled.

The first negative voltage generator may include a control signal generator generating a control signal which combines the power up signal and the active signal, wherein the control signal turns off the first negative voltage generator when the power up signal is enabled and operates the first negative voltage generator when the power up signal is disabled and then the active signal is enabled; a current interrupting controller which outputs a current interrupting control signal in response to the control signal; a voltage generating controller which compares the first reference voltage and the feedback voltage in response to the current interrupting control signal and outputs the voltage generating control signal; and a negative voltage generator which receives the backbias voltage in response to the voltage generating control signal and generates the negative voltage and the feedback voltage using the received backbias voltage.

The current interrupting controller may include a first current interrupting controller which receives voltage with a positive level and the second reference voltage and outputs any one of the voltage with the positive level and the second reference voltage as the first current interrupting control signal responding to the control signal; and a second current interrupting controller which outputs the backbias voltage as a second current interrupting control signal responds to the control signal.

The second current interrupting controller may include a level shifter changing the control signal level into a level sufficient to turn on or turn off a MOS transistor; and a backbias voltage supplier supplying the backbias voltage as the second current interrupting control signal when the signal output from the level shifter is enabled.

The voltage generating controller may include a bias supplier supplying the voltage with the positive level responding to the first current interrupting control signal; and a comparator comparing the first reference voltage and the feedback voltage to output the voltage generating control signal when voltage is supplied from the bias supplier.

Preferably, the comparator is floated from the backbias voltage when the second current interrupting control signal is a low level.

The negative voltage generator may include a negative voltage output unit outputting the backbias voltage as the negative voltage responding to the voltage generating control signal; and a feedback voltage generator dividing voltage between the negative voltages by receiving the voltage with the positive level and generating the feedback voltage.

The negative voltage output unit may include a MOS transistor turned on when the voltage generating control signal is enabled to apply the backbias voltage.

The second negative voltage generator may include a control signal generator which turns off the second negative generator using the power up signal as an input when the power up signal is enabled and generates a control signal to operate the second negative voltage generator when the power up signal is disabled; a current interrupting controller which responds to the control signal to output the current interrupting control signal; a voltage generating controller which compares the first reference voltage and feedback voltage responding to the current interrupting control signal and outputs the voltage generating control signal; and a negative voltage generator which receives the backbias voltage in response to the voltage generating control signal and generates the negative voltage and the feedback voltage using the received backbias voltage.

The current interrupting controller may include a first current interrupting controller which receives voltage with a positive level and the second reference voltage and outputs any one of the voltage with the positive level and the second reference voltage as the first current interrupting control signal responding to the control signal; and a second current interrupting controller which outputs the backbias voltage as a second current interrupting control signal in response to the control signal.

The second current interrupting controller may include a level shifter changing the control signal level into a level sufficient to turn on or turn off a MOS transistor; and a backbias voltage supplier supplying the backbias voltage as the second current interrupting control signal when the signal output from the level shifter is enabled.

The voltage generating controller may include a bias supplier supplying the voltage with the positive level responding to the first current interrupting control signal; and a comparator comparing the first reference voltage and the feedback voltage and outputting the voltage generating control signal when voltage is supplied from the bias supplier.

Preferably, the comparator is floated from the backbias voltage when the second current interrupting control signal is a low level.

The negative voltage generator may include a negative voltage output unit outputting the backbias voltage as the negative voltage in response to the voltage generating control signal; and a feedback voltage generator dividing voltage between the negative voltages by receiving the voltage with the positive level and generates the feedback voltage.

The negative voltage output unit may include a MOS transistor turned on when the voltage generating control signal is enabled to apply the backbias voltage.

The present invention includes a negative voltage generating device that provides a stable negative voltage with a small ripple.

Additionally, the present invention provides a negative voltage generating device capable of reducing current consumption by interrupting the current path during an initial power up operation of the semiconductor device.

Additionally, the present invention provides a semiconductor device capable of selectively operating only some of a plurality of negative voltage generators.

Additionally, the present invention prevents malfunction of the memory device by a turn on of a parasitic diode in a sub wordline driver applied with negative voltage.

DESCRIPTION OF SPECIFIC EMBODIMENTS

Embodiments of the present invention include a negative voltage generating device capable of providing a stable negative voltage by comparing a reference voltage and a feedback voltage and capable of reducing current consumption by disabling the device if the operation of the device is unnecessary.

Figure 6:
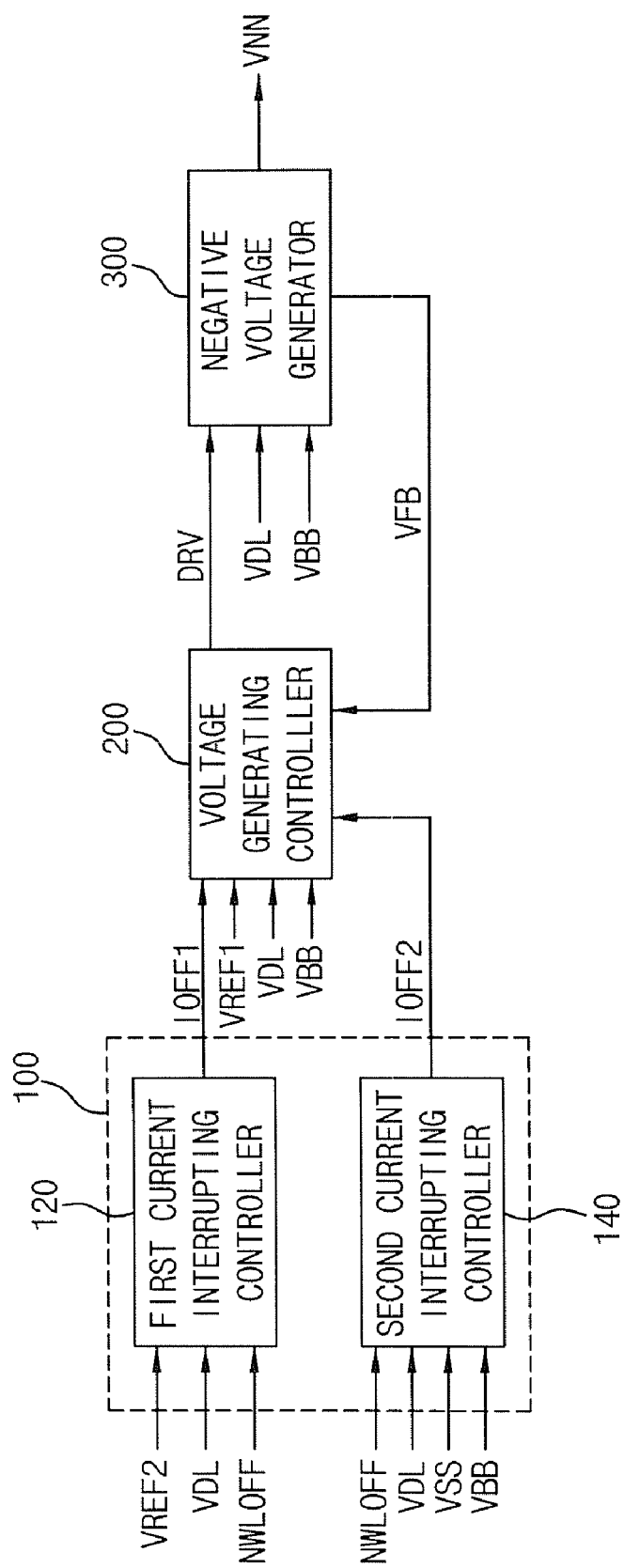
FIG. 6 is a block diagram showing a negative voltage generating device according to the present invention.

FIG. 6 is a block diagram of a negative voltage generating device according to the present invention.

Referring to FIG. 6, the negative voltage generating device includes a controller 100 for interrupting a current path in order to reduce current consumption if the current path meets a specific condition, a voltage generating controller 200 controlling voltage generation by comparing a reference voltage and a feedback voltage, and a negative voltage generator 300 responding to the output of the voltage generating controller 200 to generate a negative voltage.

The current interrupting controller 100 includes a first current interrupting controller 120 and a second current interrupting controller 140.

The first current interrupting controller 120 receives a reference voltage VREF2, a power supply voltage VDL, and a control signal NWLOFF; and the first current interrupting controller selects one of the reference voltage VREF2 and the power supply voltage VDL according to the level of the control signal NWLOFF, thereby outputting the selected signal as a first current interrupting control signal IOFF1.

The second current interrupting controller 140 receives the control signal NWLOFF and outputs a backbias voltage VBB as a second current interrupting control signal IOFF2 according to the level of the control signal NWLOFF.

The voltage generating controller 200 receives a reference voltage VREF1 and a feedback voltage VFB and compares the voltage levels of these signals in order to output a voltage generating control signal DRV to the negative voltage generator 200 so that the negative voltage generator 200 operates according to the comparison result. Preferably, the voltage VDL (having the positive level) and the backbias voltage VBB (having the negative level) are input to the voltage generating controller as operating voltages. The voltage VDL (which is voltage used for operating circuits) has a slightly lower level than a typical VDD voltage. That is, the difference in potential between the VDD voltage and the backbias voltage is large, and therefore it is preferable to apply the VDL voltage having the slightly lower voltage level than the VDD voltage. However, the present invention is not limited to only the VDL voltage, and, for example, the VDD voltage may also be used.

The first current interrupting control signal IOFF1 interrupts the supply of the voltage VDL to the voltage generating controller 200. That is, if the current interrupting control signal OFF1 is enabled, the voltage generating controller 200 is floated. Accordingly, the voltage generating controller 200 is not operated when the control signal OFF1 is enabled.

A second current interrupting control signal IOFF2 interrupts the supply of the backbias voltage VBB to the voltage generating controller 100.

The negative voltage generator 300 receives the voltage VDL (having a positive level) and the backbias voltage VBB (having a negative level) and outputs the negative voltage VNN according to the voltage generating control signal DRV.

Figure 7:
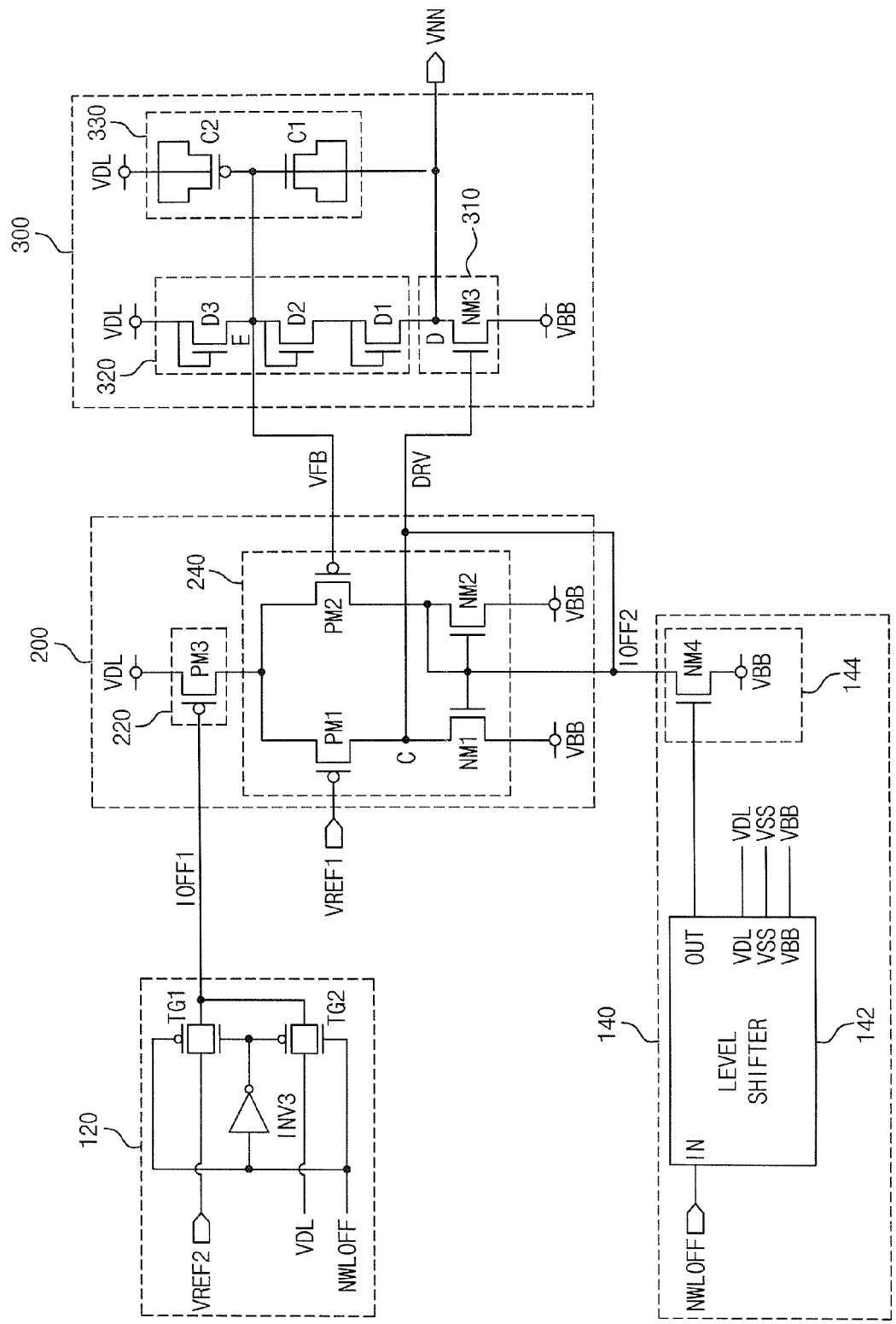
FIG. 7 is a detailed circuit diagram of FIG. 6.

FIG. 7 is a detailed circuit diagram of FIG. 6.

Referring to FIG. 7, the first current interrupting controller 120 includes a transfer gate TG1, which receives as an input the reference voltage VREF2; a transfer gate TG2, which receives as an input the voltage VDL; and an inverter INV3, which receives as an input the control signal NWLOFF. The control signal NWLOFF controls the operation (turns on/off) of the transfer gates. If the control signal NWLOFF is a high level, the power supply voltage VDL is output as the first current interrupting control signal IOFF1. Conversely, if the control signal NWLOFF is a low level, the reference voltage VREF2 is output as the first current interrupting control signal IOFF1. At this time, the reference voltage VREF2 is voltage having a voltage level that is sufficient to turn-on the PMOS transistor PM3.

Therefore, if the control signal NWLOFF is a high level, the positive voltage VDL is output to turn-off the PMOS transistor PM3, thereby interrupting the current path to the comparator 240. Thus, in a situation in which a wordline is disabled (as in the case of an initial operation applying power to a memory device) and there is no need to provide the negative voltage VDD to the wordline, the control signal NWLOFF is made a high level, thereby making it possible to reduce unnecessary current consumption. Therefore, the control signal NWLOFF may be referred to as a signal for disabling the wordline.

The second current interrupting controller 140 includes: a level shifter 142 which receives the control signal NWLOFF and changes a voltage level of an output signal in response to the control signal NWLOFF; and a backbias voltage supplier 144, which outputs the backbias signal VBB as the second current interrupting control signal IOFF2 in response to the signal output from the level shifter 142 (that is, according to the voltage level of the output signal). The backbias voltage supplier 144 includes an NMOS transistor NM4, and the gate of the NMOS transistor NM4 receives the signal output from the level shifter 142. The level shifter 142 changes the level of the input signal NWLOFF to a voltage level that is sufficient to either turn on the transistor NM4 or turn off the transistor NM4. For example, if the control signal NWLOFF is a high level, the level shifter 142 changes the control signal NWLOFF to a voltage level that is sufficient to turn on the MOS transistor NM4 (for example, changes the level to a VDL level) and the backbias voltage VBB is transmitted through the NMOS transistor NM4 and is output as the current interrupting control signal IOFF2.

The source terminal of the NMOS transistor NM4 is connected to the backbias voltage VBB and the drain terminal is connected to the gate terminals of NMOS transistors NM1 and NM2 and a node C of the comparator 240.

The voltage generating controller 200 includes a bias supplier 220 supplying the voltage VDL and the comparator 240 which receives and compares the reference voltage VREF1 to the feedback voltage VFB to output the voltage generating control signal DRV for controlling the operation of the negative voltage generator 300.

Preferably, the bias supplier 220 includes the PMOS transistor PM3, with the gate of the PMOS transistor PM3 receiving the current interrupting control signal IOFF1, the source receiving the voltage VDL, and the drain connected the comparator 240. Therefore, when the current interrupting control signal IOFF1 is enabled at the high VDL level, the PMOS transistor PM3 is turned off and the supply of voltage to the comparator 240 is interrupted, and thereby no current path is formed. Therefore, unnecessary current consumption can be reduced by interrupting the current path when the negative voltage is not needed.

Preferably, the comparator 240 includes a differential amplifier including a plurality of transistors PM1, PM2, NM1, and NM2. The gate terminal of the PMOS transistor PM1 receives the reference voltage VREF1, and the gate terminal of the PMOS transistor PM2 receives the feedback voltage VFB. The NMOS transistors NM1 and NM2 are formed in a current mirror structure, and the backbias voltage is applied to their drain terminals. Thus, the NMOS transistor NM1 is connected to the PMOS transistor PM1, and the NMOS transistor NM2 is connected to the PMOS transistor PM2. The gate terminals of the NMOS transistors NM1, NM2 are connected to the current interrupting control signal IOFF2. The voltage generating control signal DRV is output from node C between the PMOS transistor PM1 and the NMOS transistor NM1. The node C receives the current interrupting control signal IOFF2. Therefore, if the backbias voltage VBB level is provided as the current interrupting control signal IOFF2 (as occurs when the signal NWLOFF is a high level), the NMOS transistors NM1 and NM2 are turned off to interrupt the supply of voltage to the comparator 240.

The negative voltage generator 300 includes a negative voltage output unit 310 which receives and outputs the backbias voltage VBB in response to the voltage generating control signal DRV output from node C to output the negative voltage VNN; a feedback voltage generator 320 which divides the voltage difference of the negative voltage VNN and the power supply voltage VDL to generate the feedback voltage VFB; and a noise removing unit 330 which removes noise of the feedback voltage VFB and improves phase characteristics.

The negative voltage output unit 310 includes an NMOS transistor NM3, with the gate terminal of the NMOS transistor NM3 being connected to the voltage generating control signal DRV, and the source terminal being connected to the backbias voltage VBB. If the voltage generating control signal DRV is a high level, the NMOS transistor NM3 is turned on to output the backbias voltage VBB (which is input to the source terminal of the NMOS transistor NM3 and output as the negative voltage VNN at the drain terminal). The NMOS transistor NM3 is connected to the feedback voltage generator 320 and the noise removing unit 330 through node D. The feedback voltage generator 320 is connected to the voltage VDL and the negative voltage VNN and generates the feedback voltage by voltage division using a plurality of resistance elements and outputs the feedback voltage VFB through node E. In the present embodiment, the resistance elements include MOS diodes D1, D2, and D3. In the noise removing unit, capacitors C1 and C2 connected to the node E may be used.

If the voltage generating control signal DRV is a high level, the NMOS transistor NM3 is turned-on to output the backbias voltage VBB (which is input through its source terminal) as the negative voltage VNN. Since the transistor NM3 is an analog type, although it is turned on, current does not flow at a time but is slowly increased. In other words, if the transistor NM3 is turned-on, the negative voltage VNN gradually reaches a level approximately that of the backbias voltage VBB. The feedback voltage VFB generated by the voltage division of the potential difference of the voltage VDL and the negative voltage VBB is output through the node E. The feedback voltage VFB is then input to the gate terminal of the PMOS transistor PM2 in the comparator 240. As the potential of the negative voltage VNN falls to almost the backbias voltage VBB level, the feedback voltage VFB also falls. As the feedback voltage gradually falls, if the level of the feedback voltage falls to a level lower than that of the reference voltage VREF1, the voltage generating control signal DRV is disabled (a low level) so that the NMOS transistor NM3 is turned off. After the NMOS transistor is turned off, as the negative voltage V is back raised, the control signal DRV also rises. This procedure is then repeated.

Therefore, when the transistor NM4 is turned-on due to the high level signal input to the gate of the NMOS transistor NM4, the backbias voltage VBB is applied to the gate terminals of the MOS transistors NM1 and NM2. Therefore, the NMOS transistors NM1, NM2, and NM3 are turned-off since the voltage of their respective gate terminal is the same as the voltage of their respective source terminal, as such there is no current flowing in the comparator 240.

Figure 8:
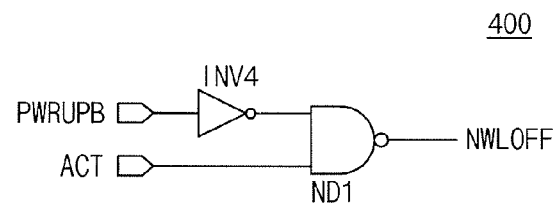
FIG. 8 is a detailed circuit diagram showing a control signal generator.

The control signal NWLOFF for controlling the current interrupting controller 100 may be generated by a circuit such as the one shown in FIG. 8.

Referring to FIG. 8, a control signal generator 400 includes an inverter IN4 receiving a power up signal PWRUPB as an input and a NAND gate ND1 receiving an output signal from the inverter INV4 and an active signal as an input.

At an initial phase when power is applied to a semiconductor memory device, if the power up signal PWRUPB is a high level, the output signal is always fixed to a high level. Therefore, malfunction in the semiconductor memory device can be prevented and the semiconductor memory device can be operated only when required. The power up signal PWRUPB is a signal that gradually increases from the point of a first application of power to the semiconductor memory device, and if the voltage is generated, the power up signal PWRUPB falls to a low level. Therefore, the power up signal PWRUPB maintains a high level during the initial phase of the semiconductor device.

Figure 9:
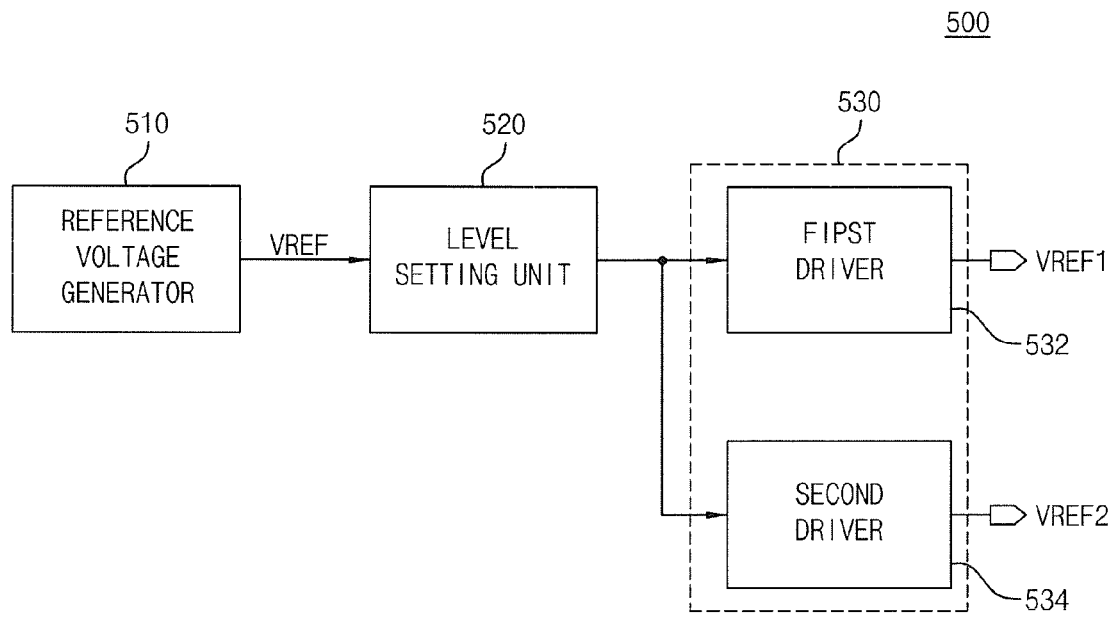
FIG. 9 is a block diagram showing a reference voltage supplier.

FIG. 9 shows an embodiment of the reference voltage supplier 500 for supplying the reference voltages VREF1 and VREF2.

Referring to FIG. 9, the reference voltage supplier 500 includes a reference voltage generator 510, a level setting unit 520, and a driver unit 530.

The reference voltage generator 510 generates and outputs predetermined reference voltage VREF using a band gap type or a widlar type generator. The reference voltage generator 510 should supply the reference voltage in a stable manner, that is, the reference voltage should be applied even at the time of its own power consumer, a level fluctuation according to a change in temperature, a fluctuation according a process procedure, and a level fluctuation in an external power supply. The band gap type makes this possible. In other words, a PN junction transistor having negative temperature coefficient characteristic with an increased level of output voltage according to an increase of temperature and a pair of junction transistors having positive temperature coefficient by the voltage difference due to different emitter sectional areas of the respective transistors to have positive temperature coefficient are used together, making it possible to generate a voltage that does not change with temperature. The reference voltage generating device using the band gap is known to those skilled in the art and can be easily implemented by those skilled in the art, and therefore, a detailed description thereof is omitted.

Figure 10:
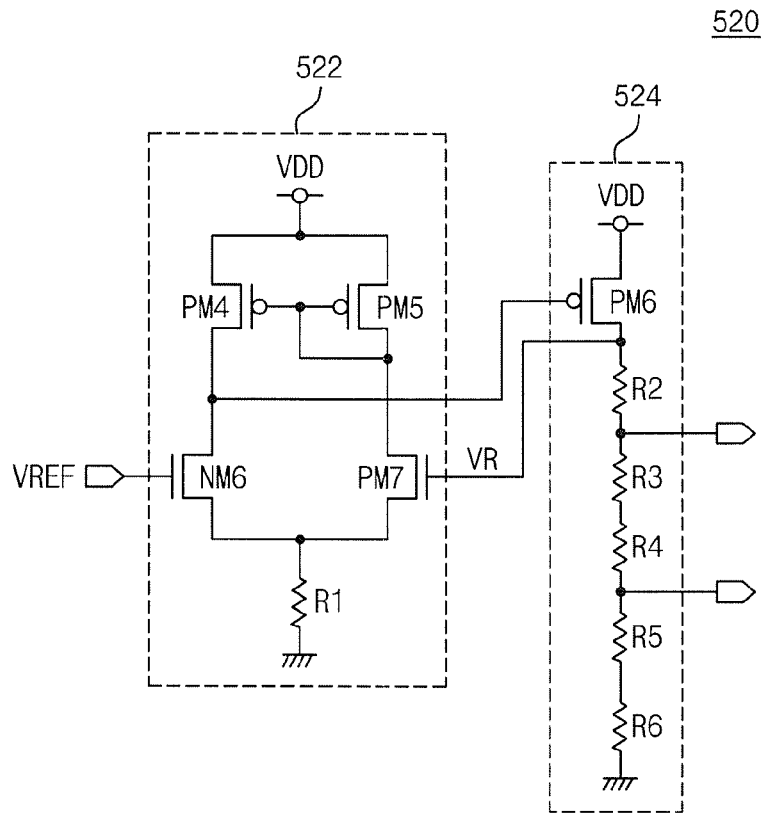
FIG. 10 is a detailed circuit diagram showing the level setting unit of FIG. 9.

FIG. 10 is a detailed circuit diagram showing the level setting unit 520 of FIG. 9.

Referring to FIG. 10, the level setting unit 520 includes a differential comparator 522 comprising two PMOS transistors PM4 and PM5, two NMOS transistors NM6 and NM7, and a resistance element R1; and a reference voltage divider 524 comprising a PMOS transistor PM6 and a plurality of resistance elements R2 to R6. The differential comparator 522 compares the reference voltage VREF (which is input to the gate of the NMOS transistor NM6) to a feedback voltage VR (which is input to the gate of the NMOS transistor NM7) so that the reference voltage VREF and the feedback voltage VR maintain the same value. In other words, the differential comparator 522 performs a function similar to that of a buffer. The reference voltage divider 524 uses a resistance ration to generate and output the reference voltage such that it has the desired level. The external voltage VDD is supplied to the reference voltage divider 524 as a driving voltage using the PMOS transistor PM6, making it possible to prevent drivability even in the case of large current consumption.

Referring back to FIG. 9, the driver unit 530 includes a first driver 532 and a second driver 534. The input signal level of the first driver 532 and the second driver 534 is different, and the first and second drivers 532, 534 have the same configuration.

Figure 11:
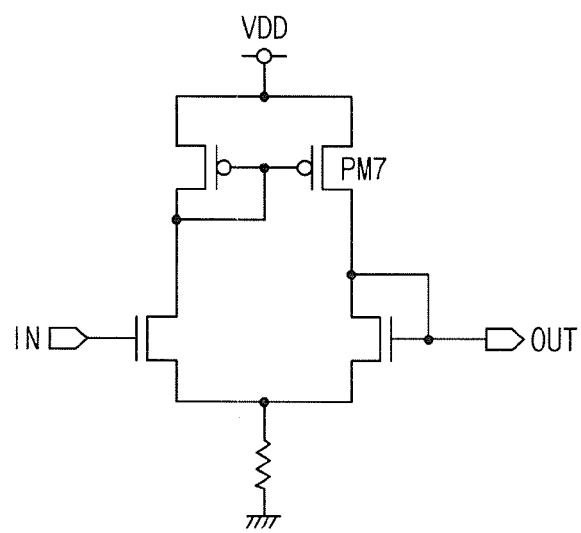
FIG. 11 is a detailed circuit diagram showing the driver of FIG. 9.

FIG. 11 is a detailed circuit diagram showing the driver 530 of FIG. 9.

Referring to FIG. 11, the first driver and the second driver 532 and 534 compare an input signal IN to an output signal OUT and cause the voltage of the output signal OUT to have the same level as that of the input signal IN. The drivers 532 and 534 can also be configured of a differential comparator structure including the PMOS transistor and the NMOS transistor. If the output signal OUT is lower than the input signal IN when the input signal IN and the output signal OUT are compared, a PMOS transistor PM7 is turned on to receive voltage from the external voltage VDD, thereby increasing the output signal OUT level to the input signal IN level. Conversely, if the output signal OUT is higher than the input signal IN, the PMOS transistor PM7 is turned off, thereby allowing the output signal OUT level to be the same as the input signal IN level. In FIG. 11, the input signal IN may be the reference voltage with a predetermined level output from the level setting unit 520, and the output signal OUT may be the reference voltages VREF1 and VREF2, which are resultant output signals.

Figure 12:
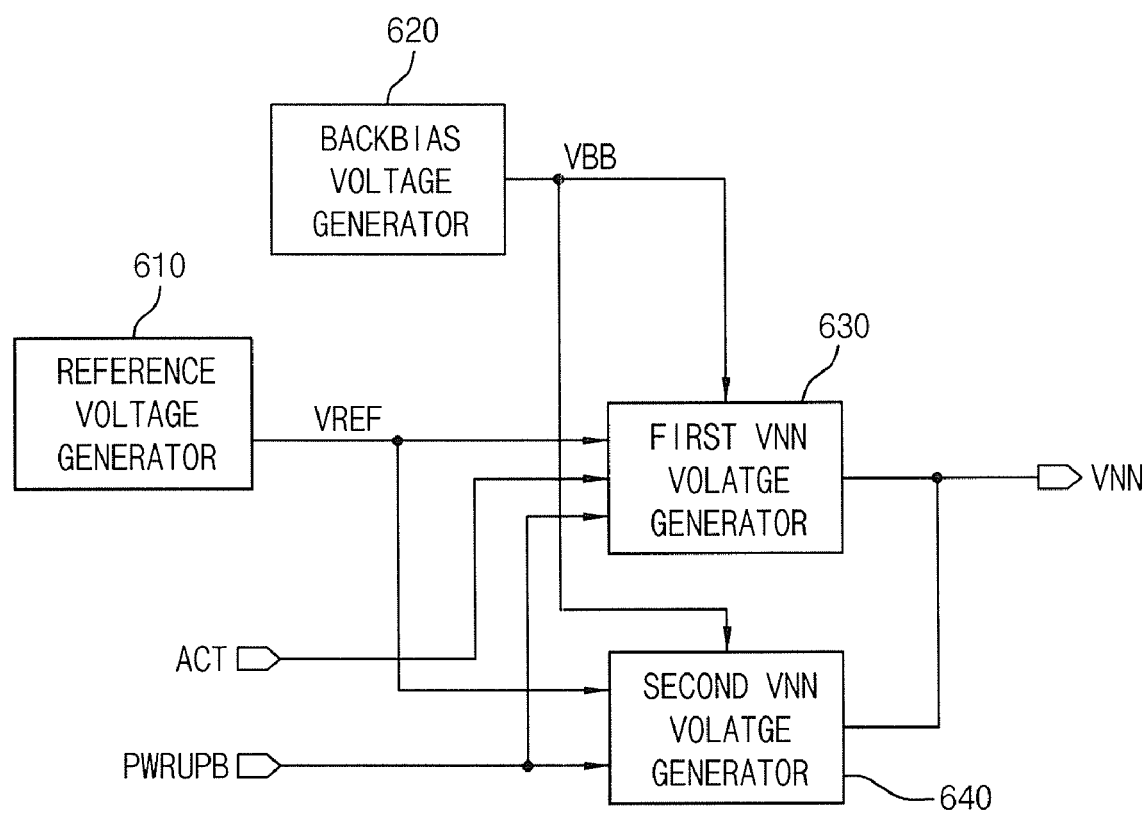
FIG. 12 is a block diagram showing another embodiment of a negative voltage generating device according to the present invention.

FIG. 12 shows an embodiment of the present invention in which the aforementioned negative voltage generating device is applied to an actual memory device.

FIG. 12 shows a reference voltage generator 610, a backbias voltage generator 620, a first negative voltage generator 630, and a second negative generator 640.

Figure 3:
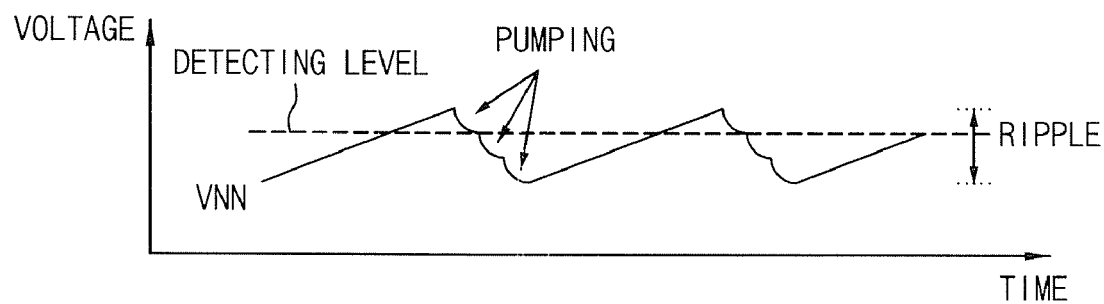
FIG. 3 is a waveform shown for illustrating the resultant negative voltage generated by the negative voltage generating circuit of FIG. 1.
Figure 4:
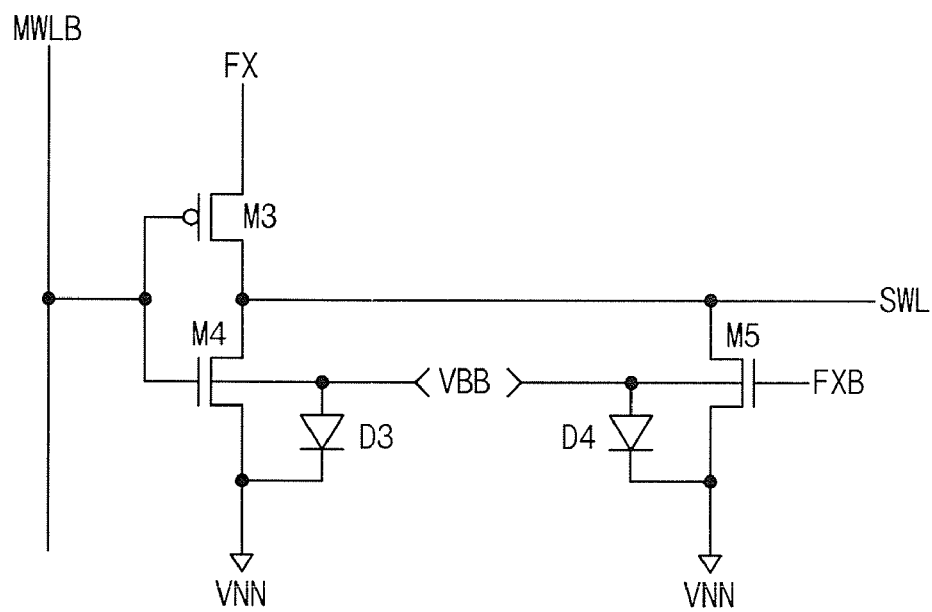
FIG. 4 is a structure diagram showing a sub wordline driver in a semiconductor memory device which receives the negative voltage and backbias voltage.
Figure 5:
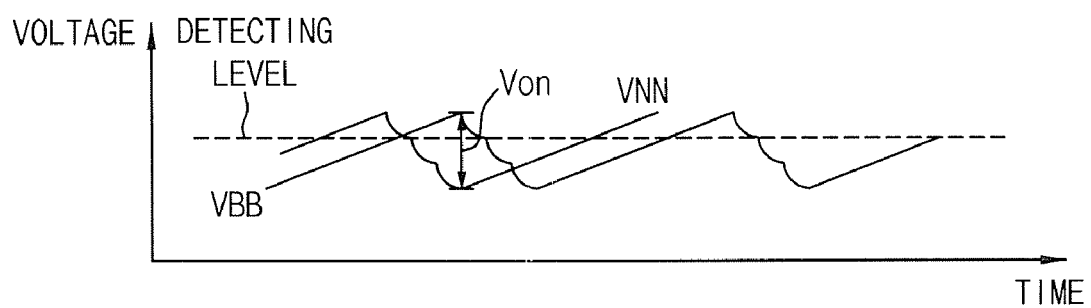
FIG. 5 is a waveform diagram shown for illustrating the backbias voltage and negative voltage generated by the negative voltage generating circuit of FIG. 1.

The first negative voltage generator 630 is operated using an active signal ACT and a power up signal PWRUPB as an input. As described above with reference to FIG. 3, during an initial operation, if the power up signal PWRUPB is a high level, the current path is interrupted so that the first negative voltage generator 630 does not operate. Thereafter, although the power up signal PWRUPB is a low level, the active signal ACT is disabled (a low level) during standby mode so that the first negative voltage generator 630 does not operate.

The second negative voltage generator 640 is controlled only by the power up signal PWRUPB. Therefore, if the power up signal PWRUPB is a low level, the second negative voltage generator 640 is operated normally. When in standby mode, the first negative voltage generator 630 does not operate, but the second negative voltage generator 640 operates normally to generate and output the negative voltage VNN. In other words, the second negative voltage generator 640 is always enabled after power is applied. Therefore, it is preferable to reduce current consumption by making the size of the NMOS transistor NM3 (FIG. 7) small.

As described above, the negative voltage generator operated in the standby mode and the negative voltage generator operated in the active mode coexist, and the proper number of the negative voltage generators operate according to the received signals, thereby making it possible to efficiently control power consumption.

Figure 1:
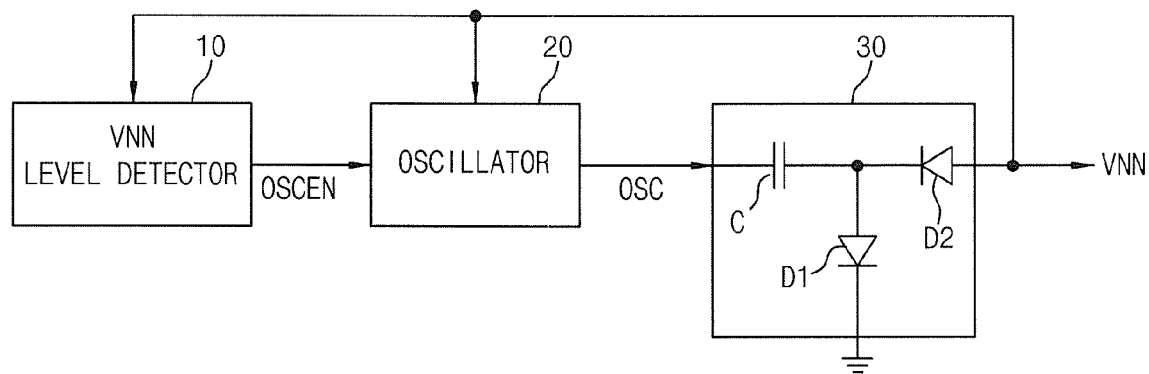
FIG. 1 is a block diagram of a negative voltage generating circuit.
Figure 2:
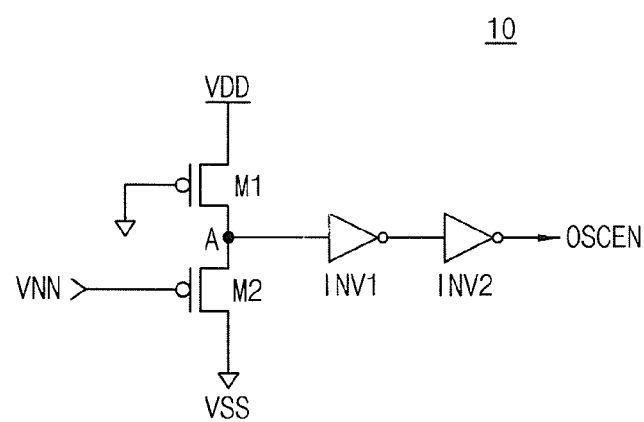
FIG. 2 is a detailed circuit diagram showing the VNN level detector 10 of FIG. 1.
Figure 13:
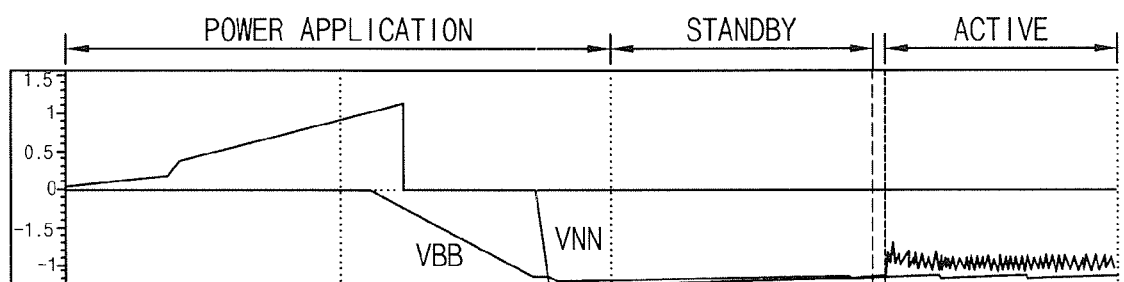
FIG. 13 is a graph showing a simulation result of the negative voltage generated according to the negative voltage generating circuit of FIG. 1 and the negative voltage generating circuit of FIG. 6.
Figure 13:
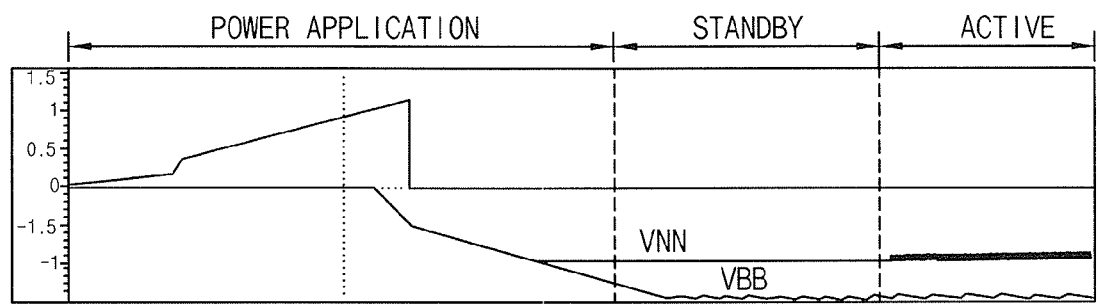

FIG. 13 is a graph comparing the negative voltage generated according to the circuit shown in FIG. 1 and the negative voltage generated according to the embodiment of the present invention shown in FIG. 7.

FIG. 13(a) is a simulation result of the negative voltage generated according to the circuit of FIG. 1 and FIG. 13(b) is a simulation result of the negative voltage generated according to the embodiment of the present invention shown in FIG. 7. When comparing FIG. 13(b) to FIG. 13(a), it can be confirmed that the negative voltage VNN of FIG. 13(b) has a small ripple and is stable, and also the negative voltage VNN shown in FIG. 13(b) always maintains a higher voltage level than the backbias voltage.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the accompanying claims.

What is claimed is:

1. A negative voltage generating device comprising:
   a current interrupting controller outputting a current interrupting control signal in response to a control signal, wherein the control signal is enabled according to the voltage level of a power-up signal;
   a voltage generating controller receiving and comparing a first reference voltage and a feedback voltage and outputting a voltage generating control signal in response to the current interrupting control signal, wherein the voltage level of the voltage generating control signal depends upon the result of the comparison of the first reference voltage and the feedback voltage; and
   a negative voltage generator receiving a first negative voltage depending upon the voltage level of the voltage generating control signal and generating a second negative voltage based on the first negative voltage.

2. The negative voltage generating device as set forth in claim 1, wherein the first negative voltage is a backbias voltage having a voltage level that is lower than the second negative voltage.

3. The negative voltage generating device as set forth in claim 2, wherein the current interrupting controller comprises:
   a first current interrupting controller receiving a voltage having a positive level and a second reference voltage having a negative level, wherein one of the second reference voltage and the voltage having the positive level is output as the first current interrupting control signal in response to the control signal; and
   a second current interrupting controller outputting the backbias voltage as a second current interrupting control signal in response to the control signal.

4. The negative voltage generating device as set forth in claim 3, wherein the second current interrupting controller comprises:
   a level shifter changing the voltage level of the control signal level into an enabled voltage level sufficient to turn on a MOS transistor or a disabled voltage level sufficient to turn off the MOS transistor; and a backbias voltage supplier supplying the backbias voltage as the second current interrupting control signal when the signal output from the level shifter is the enabled voltage level.

5. The negative voltage generating device as set forth in claim 3, wherein the voltage generating controller comprises:
   a bias supplier supplying a voltage having a positive level in response to the first current interrupting control signal; and
   a comparator comparing the first reference voltage and the feedback voltage and outputting the voltage generating control signal having the voltage level dependent upon the comparison result when the positive level voltage is supplied from the bias supplier.

6. The negative voltage generating device as set forth in claim 5, wherein the comparator is not operated when the control signal is enabled.

7. The negative voltage generating device as set forth in claim 5, wherein the comparator comprises:
   a first PMOS transistor receiving the first reference voltage as its gate input,
   a second PMOS transistor receiving the feedback voltage as its gate input,
   a first NMOS transistor having a drain terminal connected to the first PMOS transistor and a gate terminal receiving the second current interrupting control signal, and
   a second NMOS transistor having a drain terminal connected to the second PMOS transistor and a gate terminal receiving the second current interrupting control signal.

8. The negative voltage generating device as set forth in claim 7, wherein the voltage generating control signal is output through a connection node shared by the first PMOS transistor and the first NMOS transistor and the second current interrupting control signal is applied to the connection node.

9. The negative voltage generating device as set forth in claim 2, wherein the negative voltage generator comprises:
   a negative voltage output unit receiving the back bias voltage and outputting the second negative voltage in response to the voltage generating control signal; and
   a feedback voltage generator generating the feedback voltage by dividing a difference in potential between a voltage having a positive level and the second negative voltage.

10. The negative voltage generating device as set forth in claim 9, further comprising a noise removing unit connected to a node outputting the feedback voltage to remove noise in the feedback voltage, wherein the noise removing unit is connected between the voltage with the positive level and the second negative voltage.

11. The negative voltage generating device as set forth in claim 9, wherein the negative voltage output unit comprises a MOS transistor turned on when the voltage generating control signal is enabled to receive the backbias voltage and output the second negative voltage.

12. The negative voltage generating device as set forth in claim 1, further comprising a control signal generator performing a logical combination on an active signal and the power up signal, wherein the control signal generator enables the control signal during an initial power supply phase of a semiconductor device.

13. The negative voltage generating device as set forth in claim 12, wherein the control signal is enabled when the power up signal is enabled or the power up signal and the activation signal are disabled.

14. The negative voltage generating device as set forth in claim 3, further comprising a reference voltage supplier which generates a reference voltage using an external voltage and supplies the first and second reference voltages by voltage division of the reference voltage.

15. The negative voltage generating device as set forth in claim 14, wherein the reference voltage supplier comprises:
   a reference voltage generator generating the reference voltage using a band gap type or a widlar type circuit;
   a level setting unit outputting voltages having a level corresponding to the first and second reference voltages by voltage division of the reference voltage; and
   a driver unit outputting the respective voltages output from the level setting unit as the first and second reference voltages, wherein the first and second reference voltages are output at targeted values by supplying external voltage when the voltage levels are below the targeted values of the first and second reference voltage levels.

16. The negative voltage generating device as set forth in claim 15, wherein the level setting unit comprises:
   a differential comparator outputting the reference voltage such that the reference voltage maintains a predetermined level; and
   a reference voltage divider receiving the output of the differential comparator and outputting a feedback signal to the differential comparator in order to generate output signals at levels corresponding to the first and second reference voltages using a resistance ratio.

17. A negative voltage generating device comprising:
   a reference voltage generator generating first and second reference voltages each having a negative voltage level;
   a first negative voltage generator receiving the first and second reference voltages and a backbias voltage and generating a negative voltage in response to an active signal and a powerup signal, wherein the powerup signal is enabled during an initial operation of a semiconductor device in which power is supplied to the device; and
   a second negative voltage generator receiving the first and second reference voltages and the backbias voltage and outputting a negative voltage in response to the power up signal.

18. The negative voltage generating device as set forth in claim 17, wherein the first negative voltage generator is operated only when the power up signal is disabled and the active signal is enabled.

19. The negative voltage generating device as set forth in claim 17, wherein the second negative voltage generator is operated immediately after the power up signal is disabled.

20. The negative voltage generating device as set forth in claim 17, wherein the first negative voltage generator comprises:
   a control signal generator performing a logical combination on the power up signal and the active signal to generate a control signal,
      wherein when the power up signal is enabled the voltage level of the control signal is such that the first negative voltage generator is turned off in response to the control signal, and
      wherein when the power signal is disabled and the active signal is enabled the voltage level of the control signal is such that the first negative voltage generator is operated;
   a current interrupting controller outputting a current interrupting control signal in response to the control signal;
   a voltage generating controller comparing the first reference voltage to a feedback voltage and outputting a voltage generating control signal,
      wherein the voltage level of the voltage generating control signal depends upon the result of the comparison of the first reference voltage and the feedback voltage, and wherein the voltage generating controller operates in response to the current interrupting control signal; and a negative voltage generator receiving the backbias voltage in response to the voltage generating control signal and generating the negative voltage and the feedback voltage using the received backbias voltage.

21. The negative voltage generating device as set forth in claim 20, wherein the current interrupting controller comprises:

a first current interrupting controller receiving a voltage having a positive voltage level and the second reference voltage and outputting one of the voltage having the positive voltage level and the second reference voltage as the first current interrupting control signal in response to the control signal; and a second current interrupting controller outputting the backbias voltage as a second current interrupting control signal in response to the control signal.

22. The negative voltage generating device as set forth in claim 21, wherein the second current interrupting controller comprises:

a level shifter changing the voltage level of the control signal into a voltage level sufficient to turn on a MOS transistor or a voltage level sufficient to turn off the MOS transistor; and a backbias voltage supplier supplying the backbias voltage as the second current interrupting control signal when the signal output from the level shifter is the voltage level sufficient to turn on the MOS transistor.

23. The negative voltage generating device as set forth in claim 20, wherein the voltage generating controller comprises:

a bias supplier supplying a voltage having a positive level in response to the first current interrupting control signal; and a comparator comparing the first reference voltage and the feedback voltage to output the voltage generating control signal when the voltage having the positive level is supplied by the bias supplier.

24. The negative voltage generating device as set forth in claim 23, wherein the comparator is not operated when the control signal is enabled.

25. The negative voltage generating device as set forth in claim 20, wherein the negative voltage generator comprises:

a negative voltage output unit receiving the backbias voltage and outputting the negative voltage in response to the voltage generating control signal; and a feedback voltage generator generating the feedback voltage by dividing a difference in potential between a voltage having a positive level and the negative voltage.

26. The negative voltage generating device as set forth in claim 25, wherein the negative voltage output unit comprises a MOS transistor turned on when the voltage generating control signal is enabled to receive the backbias voltage and output the negative voltage.

27. The negative voltage generating device as set forth in claim 17, wherein the second negative voltage generator comprises:

a control signal generator generating a control signal wherein when the power up signal is enabled the voltage level of the control signal is such that the second negative voltage generator is turned off, and wherein when the power up signal is disabled the voltage level of the control signal is such that the second negative voltage generator is operated;

a current interrupting controller outputting a current interrupting control signal in response to the control signal;

a voltage generating controller comparing the first reference voltage to a feedback voltage and outputting a voltage generating control signal, wherein the voltage level of the voltage generating control signal depends upon the result of the comparison of the first reference voltage and the feedback voltage, and wherein the voltage generating controller operates in response to the current interrupting control signal; and a negative voltage generator receiving the backbias voltage in response to the voltage generating control signal and generating the negative voltage and the feedback voltage using the received backbias voltage.

28. The negative voltage generating device as set forth in claim 27, wherein the current interrupting controller comprises:

a first current interrupting controller receiving a voltage having a positive level and the second reference voltage and outputting one of the voltage having the positive level and the second reference voltage as the first current interrupting control signal in response to the control signal; and a second current interrupting controller outputting the backbias voltage as a second current interrupting control signal in response to the control signal.

29. The negative voltage generating device as set forth in claim 28, wherein the second current interrupting controller comprises:

a level shifter changing the voltage level of the control signal into a voltage level sufficient to turn on a MOS transistor or a voltage level sufficient to turn off the MOS transistor; and a backbias voltage supplier supplying the backbias voltage as the second current interrupting control signal when the signal output from the level shifter is the voltage level sufficient to turn on the MOS transistor.

30. The negative voltage generating device as set forth in claim 26, wherein the voltage generating controller comprises:

a bias supplier supplying a voltage having a positive level in response to the first current interrupting control signal to; and a comparator comparing the first reference voltage and the feedback voltage to output the voltage generating control signal when the voltage having the positive level is supplied by the bias supplier.

31. The negative voltage generating device as set forth in claim 30, wherein the comparator is not operated when the control signal is enabled.

32. The negative voltage generating device as set forth in claim 27, wherein the negative voltage generator comprises:

a negative voltage output unit receiving the backbias voltage and outputting the negative voltage in response to the voltage generating control signal; and a feedback voltage generator generating the feedback voltage by dividing a difference in potential between a voltage having a positive level and the negative voltage.

33. The negative voltage generating device as set forth in claim 32, wherein the negative voltage output unit comprises a MOS transistor turned on when the voltage generating control signal is enabled to receive the backbias voltage and output the negative voltage.

* * * * *